US009129729B2

(12) United States Patent
Ishizuka et al.

(10) Patent No.: US 9,129,729 B2
(45) Date of Patent: Sep. 8, 2015

(54) CERAMIC ELECTRONIC COMPONENT

(71) Applicant: Murata Manufacturing Co., Ltd., Nagaokakyo-shi, Kyoto-fu (JP)

(72) Inventors: Akira Ishizuka, Nagaokakyo (JP); Yasuhiro Nishisaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 161 days.

(21) Appl. No.: 14/068,049

(22) Filed: Oct. 31, 2013

(65) Prior Publication Data

US 2014/0125195 A1     May 8, 2014

(30) Foreign Application Priority Data

Nov. 7, 2012    (JP) ................................ 2012-245159

(51) Int. Cl.
| | |
|---|---|
| *H01G 4/232* | (2006.01) |
| *H01C 7/00* | (2006.01) |
| *H01G 4/12* | (2006.01) |
| *H01L 41/047* | (2006.01) |
| *H01G 4/30* | (2006.01) |
| *H01C 7/18* | (2006.01) |
| *H01F 17/00* | (2006.01) |

(52) U.S. Cl.
CPC ................ *H01C 7/008* (2013.01); *H01C 7/18* (2013.01); *H01G 4/12* (2013.01); *H01G 4/2325* (2013.01); *H01G 4/30* (2013.01); *H01L 41/0472* (2013.01); *H01F 17/0013* (2013.01); *H01G 4/232* (2013.01)

(58) Field of Classification Search
CPC ....... H01G 4/30; H01G 4/232; H01G 4/2325; H01G 4/33; H01G 4/005; H01G 4/008; H01G 4/012; H01G 4/228; H01G 4/248; H01G 2/06; H01G 2/106

USPC ................................ 361/301.4, 306.1, 306.3
See application file for complete search history.

(56) References Cited

U.S. PATENT DOCUMENTS

| | | |
|---|---|---|
| 2009/0284896 A1 | 11/2009 | Sakaguchi et al. |
| 2010/0123994 A1 | 5/2010 | Nishisaka et al. |
| 2010/0128411 A1 | 5/2010 | Onishi et al. |
| 2011/0290542 A1 | 12/2011 | Nishisaka et al. |
| 2012/0018204 A1 | 1/2012 | Sato et al. |
| 2012/0019099 A1 | 1/2012 | Sato et al. |
| 2012/0057268 A1 | 3/2012 | Tsutsumi |
| 2013/0279071 A1* | 10/2013 | Okamoto et al. .......... 361/301.4 |
| 2013/0299215 A1* | 11/2013 | Taseda et al. ................. 174/255 |

FOREIGN PATENT DOCUMENTS

| | | | | |
|---|---|---|---|---|
| JP | 11-111564 | * | 4/1999 | ............... H01G 4/40 |
| JP | 2008-205073 A | | 9/2008 | |

(Continued)

OTHER PUBLICATIONS

Official Communication issued in corresponding Japanese Patent Application No. 2012-245159, mailed on Oct. 7, 2014.

*Primary Examiner* — Dion R Ferguson
(74) *Attorney, Agent, or Firm* — Keating & Bennett, LLP

(57) ABSTRACT

A ceramic electronic component includes a ceramic base body and first and second outer electrodes. The ceramic base body includes first and second primary surfaces, first and second side surfaces, and first and second end surfaces. The first and second outer electrodes are arranged on the ceramic base body so that front end portions of the outer electrodes face each other. The first and the second outer electrodes include outermost layers each containing Cu. Outermost layers of the facing front end portions of the first and the second outer electrodes are more oxidized than outermost layers of the other portions of the first and the second outer electrodes.

20 Claims, 3 Drawing Sheets

(56) References Cited

FOREIGN PATENT DOCUMENTS

| | | |
|---|---|---|
| JP | 2009-253010 A | 10/2009 |
| JP | 2010-129737 A | 6/2010 |
| JP | 2010-141300 A | 6/2010 |
| JP | 2012-009813 A | 1/2012 |
| JP | 2012-028457 A | 2/2012 |
| JP | 2012-028458 A | 2/2012 |
| JP | 2012-38790 A | 2/2012 |
| JP | 2012-080079 A | 4/2012 |

* cited by examiner

CERAMIC ELECTRONIC COMPONENT

BACKGROUND OF THE INVENTION

1. Field of the Invention

The present invention relates to a ceramic electronic component.

2. Description of the Related Art

Concomitant with the recent increasing requirement for reduction in size of an electronic device, the reduction in size thereof by embedding a ceramic electronic component in a circuit board has been proposed (for example, see Japanese Unexamined Patent Application Publication No. 2010-129737).

In general, a ceramic electronic component embedded in a circuit board is electrically connected to a wire through a via hole electrode. A via hole for forming this via hole electrode is formed by irradiating an outer electrode of the ceramic electronic component in the circuit board with laser light. Hence, a board-embedded type ceramic electronic component is required to have an outer electrode excellent in laser resistance. Accordingly, there has been proposed a ceramic electronic component having outer electrodes, each of which includes a Cu layer containing Cu or a Cu alloy as the outermost layer.

However, Cu has been known as an element liable to cause ion migration as an Ag element. Hence, when the outermost layers of the outer electrodes are each formed of a Cu layer, ion migration of Cu is liable to occur. When the ion migration of Cu occurs, the outer electrodes may be electrically connected to each other, and as a result, a short circuit defect arises.

SUMMARY OF THE INVENTION

Accordingly, preferred embodiments of the present invention provide a ceramic electronic component in which the ion migration of Cu is not likely to occur.

According to a preferred embodiment of the present invention, a ceramic electronic component includes a ceramic base body and a first outer electrode and a second outer electrode. The ceramic base body includes a first primary surface and a second primary surface, a first side surface and a second side surface, and a first end surface and a second end surface. The first and the second outer electrodes are arranged on the ceramic base body so that front end portions of the first and the second outer electrodes face each other. The first and the second outer electrodes each include an outermost layer containing Cu. Outermost layers of the facing front end portions of the first and the second outer electrodes are more oxidized than outermost layers of the other portions of the first and the second outer electrodes.

In one specific aspect of the ceramic electronic component according to a preferred embodiment of the present invention, the first outer electrode is provided on the first end surface and extends therefrom on the first and the second primary surfaces and the first and the second side surfaces. The second outer electrode is provided on the second end surface and extends therefrom on the first and the second primary surfaces and the first and the second side surfaces. Among the first and the second primary surfaces and the first and the second side surfaces, at least on the first and the second side surfaces, the outermost layers of the facing front end portions of the first and the second outer electrodes are more oxidized than the outermost layers of the other portions of the first and the second outer electrodes.

In another specific aspect of the ceramic electronic component according to a preferred embodiment of the present invention, the outermost layers of the facing front end portions of the first and the second outer electrodes are each made of a copper oxide or a copper oxide alloy.

According to various preferred embodiments of the present invention, a ceramic electronic component in which ion migration of Cu is not likely to occur is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
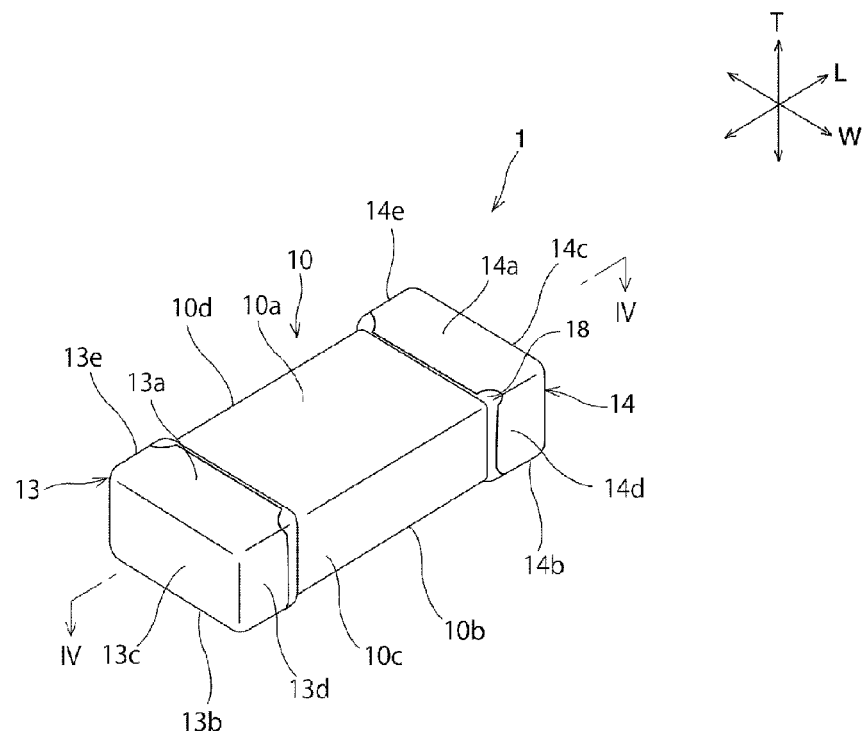
FIG. 1 is a schematic perspective view of a ceramic electronic component according to a preferred embodiment of the present invention.

Hereinafter, examples of preferred embodiments of the present invention will be described. However, the following preferred embodiments are merely described by way of example, and the present invention is not particularly limited thereto.

In addition, in each drawing used for reference to describe the preferred embodiments and the like, members having substantially the same function are designated by the same reference numerals. In addition, the drawings used for reference to describe the preferred embodiments and the like are schematically drawn, and for example, a dimensional ratio of a substance drawn in the drawing may be different from that of an actual substance. Furthermore, between the drawings, for example, a dimensional ratio of one substance shown in one drawing may be different from that of the substance shown in another drawing. The dimensional ratio of a particular substance should be understood in consideration of the following description.

Figure 2:
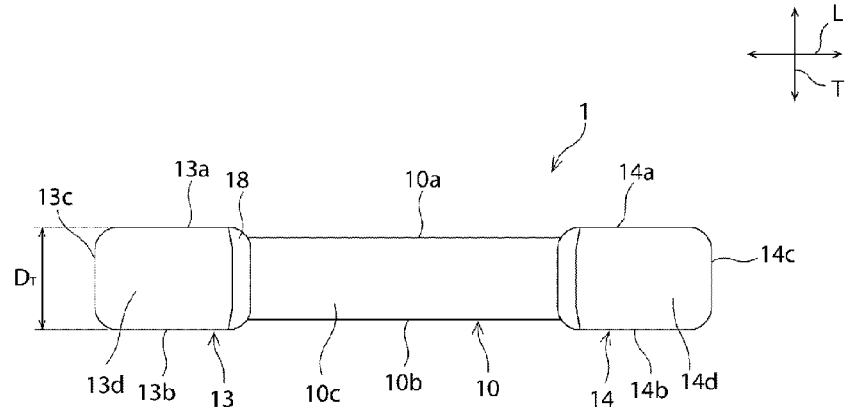
FIG. 2 is a schematic side view of the ceramic electronic component according to a preferred embodiment of the present invention.
Figure 3:
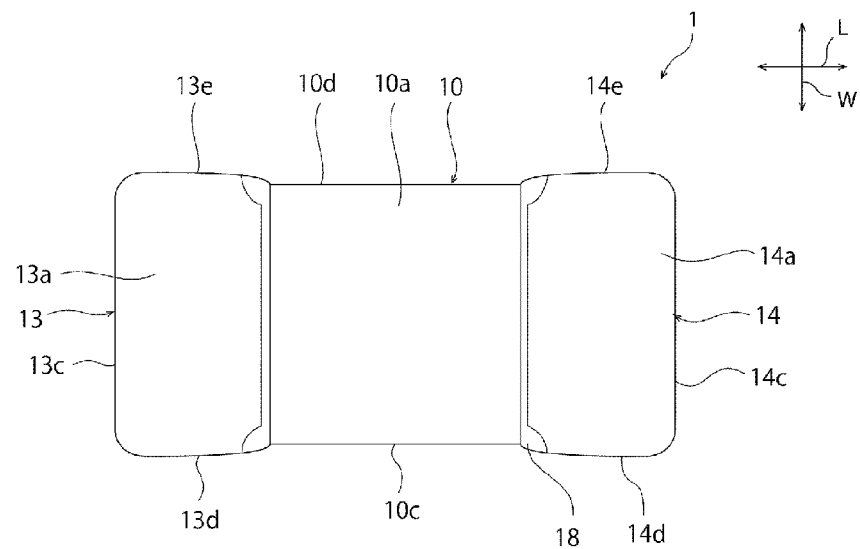
FIG. 3 is a schematic plan view of the ceramic electronic component according to a preferred embodiment of the present invention.
Figure 4:
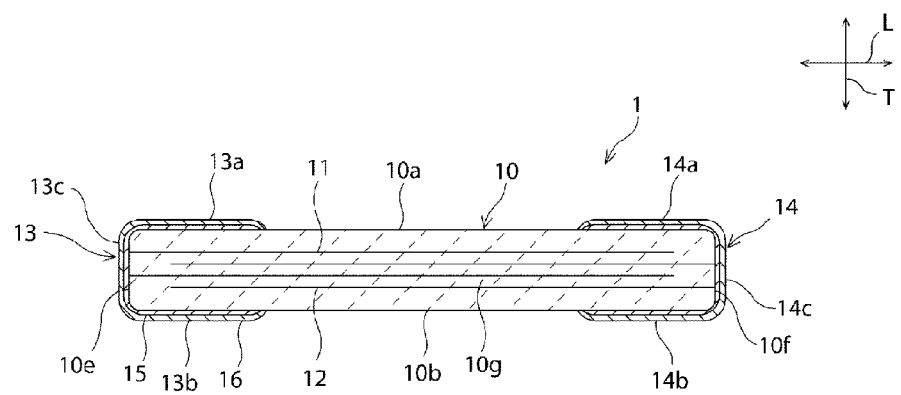
FIG. 4 is a schematic cross-sectional view of the ceramic electronic component according to a preferred embodiment of the present invention taken along the line IV-IV in FIG. 1.

FIG. 1 is a schematic perspective view of a ceramic electronic component according to this preferred embodiment. FIG. 2 is a schematic side view of the ceramic electronic component according to this preferred embodiment. FIG. 3 is a schematic plan view of the ceramic electronic component according to this preferred embodiment. FIG. 4 is a schematic cross-sectional view of the ceramic electronic component according to this preferred embodiment taken along the line IV-IV in FIG. 1.

As shown in FIGS. 1 to 4, a ceramic electronic component 1 includes a ceramic base body 10. The ceramic base body 10 is formed from an appropriate ceramic material in accordance with the function of the ceramic electronic component 1. In particular, when the ceramic electronic component 1 is a capacitor, the ceramic base body 10 may be formed from a dielectric ceramic material. As particular examples of the dielectric ceramic material, for example, $BaTiO_3$, $CaTiO_3$, $SrTiO_3$, and $CaZrO_3$ may be mentioned. In addition, besides the above ceramic material used as a primary component, in accordance with desired characteristics of the ceramic electronic component 1, at least one accessory component selected from a Mn compound, a Mg compound, a Si compound, an Fe compound, a Cr compound, a Co compound, a Ni compound, a rare earth compound, and the like may also be appropriately added to the ceramic base body 10.

When the ceramic electronic component 1 is a ceramic piezoelectric element, the ceramic base body 10 may be formed from a piezoelectric ceramic material. As particular examples of the piezoelectric ceramic material, for example, a lead titanate zirconate (PZT) ceramic material may be mentioned.

When the ceramic electronic component 1 is a thermistor element, the ceramic base body 10 may be formed from a semiconductor ceramic material. As particular examples of the semiconductor ceramic material, for example, a spinel-based ceramic material may be mentioned.

When the ceramic electronic component 1 is an inductor element, the ceramic base body 10 may be formed from a magnetic ceramic material. As particular examples of the magnetic ceramic material, for example, a ferrite ceramic material may be mentioned.

The ceramic base body 10 preferably has a rectangular or substantially rectangular parallelepiped shape, for example. The ceramic base body 10 includes a first and a second primary surface 10a and 10b, a first and a second side surface 10c and 10d, and a first and a second end surface 10e and 10f (see FIG. 4). As shown in FIGS. 1 to 3, the first and the second primary surfaces 10a and 10b each extend in a length direction L and a width direction W. The first primary surface 10a and the second primary surface 10b face each other in a thickness direction T. The first side surface 10c and the second side surface 10d each extend in the thickness direction T and the length direction L. The first side surface 10c and the second side surface 10d face each other in the width direction W. As shown in FIG. 4, the first end surface 10e and the second end surface 10f each extend in the thickness direction T and the width direction W. The first end surface 10e and the second end surface 10f face each other in the length direction L.

In addition, in this specification, the "substantially rectangular parallelepiped shape" includes a substantially rectangular parallelepiped shape in which corner and/or ridge sections are chamfered and/or rounded. That is, a member having the "substantially rectangular parallelepiped shape" includes any members each having a first and a second primary surface, a first and a second side surface, and a first and a second end surface. In addition, the primary surfaces, the side surfaces, and the end surfaces may be entirely or partially formed to have a substantially concave-convex shape. That is, the primary surfaces, the side surfaces, and the end surfaces each are not always required to be flat.

Although the dimensions of the ceramic base body 10 are not particularly limited, when the thickness dimension, the length dimension, and the width dimension of the ceramic base body 10 are represented by T, L, and W, respectively, the ceramic base body 10 preferably has a substantially thin shape which satisfies $T \leq W < L$, $\frac{1}{5}W \leq T \leq \frac{1}{2}W$, and $T \leq 0.3$ mm, for example. In particular, $0.05\ mm \leq T \leq 0.3\ mm$, $0.4\ mm \leq L \leq 1\ mm$, and $0.3\ mm \leq W \leq 0.5\ mm$ are preferably satisfied, for example.

As shown in FIG. 4, in the ceramic base body 10, first internal electrodes 11 and second internal electrodes 12, each of which preferably has a rectangular or substantially rectangular shape, are provided. The first and the second internal electrodes 11 and 12 each extend in the length direction and the width direction. The first internal electrodes 11 and the second internal electrode 12 are alternately provided in the thickness direction T. The first internal electrodes 11 and the second internal electrodes 12 face each other in the thickness direction with ceramic portions 10g provided therebetween. The dimension of the ceramic portion 10g along the thickness direction T may be set to, for example, about 0.5 µm to about 10 µm. In addition, materials forming the first and the second internal electrodes 11 and 12 are not particularly limited. The first and the second internal electrodes 11 and 12 may be formed, for example, from a metal, such as Ni, Cu, Ag, Pd, or Au, or an alloy, such as an Ag—Pd alloy, containing at least one of the metals mentioned above.

The thickness of each of the first and the second internal electrodes 11 and 12 is also not particularly limited. The thickness of each of the first and the second internal electrodes 11 and 12 may be set, for example, to approximately about 0.2 µm to about 2 µm.

As shown in FIGS. 1 to 4, on the surfaces of the ceramic base body 10, a first and a second outer electrode 13 and 14 are provided. The first and the second outer electrodes 13 and 14 are arranged on the ceramic base body 10 so that front end portions of the outer electrodes face each other.

The first outer electrode 13 is provided on the first end surface 10e and extends therefrom on the first and the second primary surfaces 10a and 10b and the first and the second side surfaces 10c and 10d. The first outer electrode 13 includes a first portion 13a located on the first primary surface 10a, a second portion 13b located on the second primary surface 10b, a third portion 13c located on the first end surface 10e, a fourth portion 13d located on the first side surface 10c, and a fifth portion 13e located on the second side surface 10d. The first outer electrode 13 is electrically connected to the first internal electrodes 11 at the third portion 13c located on the first end surface 10e.

The second outer electrode 14 is provided on the second end surface 10f and extends therefrom on the first and the second primary surfaces 10a and 10b and the first and the second side surfaces 10c and 10d. The second outer electrode 14 has a first portion 14a located on the first primary surface 10a, a second portion 14b located on the second primary surface 10b, a third portion 14c located on the second end surface 10f, a fourth portion 14d located on the first side surface 10c, and a fifth portion 14e located on the second side surface 10d. The second outer electrode 14 is electrically connected to the second internal electrodes 12 at the third portion 14c located on the second end surface 10f.

The first and the second outer electrodes 13 and 14 each include an outermost layer containing Cu. That is, the outermost layers of the first and the second outer electrodes 13 and 14 each contain Cu. The outermost layers of the first and the second outer electrodes 13 and 14 each may be formed from Cu or a Cu alloy, such as Cu—Ag, Cu—Au, Cu—Al, Cu—Ni, or Cu—Pd, for example.

In particular, in this preferred embodiment, the first and the second outer electrodes 13 and 14 are each preferably defined by a laminate of an underlying electrode layer 15 and a Cu plating layer 16. The underlying electrode layer 15 may include, for example, a metal capable of diffusing Cu and an inorganic binder. As the metal capable of diffusing Cu, for example, there may be used a metal, such as Ni, Cu, Ag, Pd, or Au, or an alloy, such as an Ag—Pd alloy, containing at least one of the metals mentioned above. The content of the metal capable of diffusing Cu in the underlying electrode layer 15 is, for example, preferably in a range of about 30 percent by volume to about 50 percent by volume. As the inorganic binder, for example, there may be used a ceramic material containing the same primary component as that of the ceramic material contained in the ceramic base body 10 or a ceramic material containing a glass component and the like. The content of the inorganic binder in the underlying electrode layer 15 is, for example, in a range of about 40 percent by volume to about 60 percent by volume. In addition, the maximum thickness of the underlying electrode layer 15 may be set, for example, to about 1 μm to about 20 μm.

The Cu plating layer 16 is provided on the underlying electrode layer 15. The Cu plating layer 16 defines the outermost layer of each of the first and the second outer electrodes 13 and 14. The maximum thickness of the Cu plating layer 16 is, for example, preferably about 1 μm to about 10 μm.

In addition, the first and the second outer electrode layers each may be entirely defined by a conductive layer containing Cu, for example.

Incidentally, as in the case of the ceramic electronic component 1 of this preferred embodiment, when the outermost layer of the outer electrode contains Cu which is liable to cause ion migration, the Cu contained in the outermost layer of the outer electrode reacts with moisture contained in an atmosphere around the ceramic electronic component 1 and is ionized. The Cu ions ($Cu^{2+}$) thus generated are moved in the moisture toward a cathode side. The Cu ions thus moved receive electrons at the cathode side, and by this reduction of the Cu ions, Cu is precipitated, so that the ion migration occurs. Accordingly, the first outer electrode and the second outer electrode may cause a short circuit in some cases.

In the ceramic electronic component 1 of this preferred embodiment, outermost layers 18 of the facing front end portions of the first and the second outer electrodes 13 and 14 are more oxidized than outermost layers of the other portions of the first and the second outer electrodes 13 and 14. The outermost layers 18 are each preferably made of a copper oxide or a copper oxide alloy (oxidized copper alloy). Accordingly, since current is not likely to flow at the facing front end portions of the first and the second outer electrodes 13 and 14, even if Cu contained in the outermost layers of the first and the second outer electrodes 13 and 14 are ionized, a phenomenon is not likely to occur in which the Cu ions thus generated receive electrons at the cathode side, and by this reduction of the Cu ions, Cu is precipitated; hence, the ion migration is suppressed or prevented. As a result, the first outer electrode 13 and the second outer electrode 14 are prevented from being short-circuited.

In this preferred embodiment, on all the first and the second primary surfaces 10a and 10b and the first and the second side surfaces 10c and 10d, the outermost layers 18 of the facing front end portions of the first and the second outer electrodes 13 and 14 are more oxidized than the outermost layers of the other portions of the first and the second outer electrodes 13 and 14. Accordingly, since current is not more likely to flow at the facing front end portions of the first and the second outer electrodes 13 and 14, even if Cu contained in the outermost layers of the first and the second outer electrodes 13 and 14 are ionized, the phenomenon is not more likely to occur in which the Cu ions thus generated receive electrons at the cathode side, and by this reduction of the Cu ions, Cu is precipitated; hence, an effect of suppressing or preventing the ion migration is enhanced. As a result, the first outer electrode 13 and the second outer electrode 14 are more effectively suppressed or prevented from being short-circuited. In particular, on the first and the second primary surfaces 10a and 10b, since the outermost layers 18 of the facing front end portions of the first and the second outer electrodes 13 and 14 are oxidized, the effect described above is further enhanced.

However, in various preferred embodiments of the present invention, on all the first and the second primary surfaces 10a and 10b and the first and the second side surfaces 10c and 10d, the outermost layers of the facing front end portions of the first and the second outer electrodes 13 and 14 are not always required to be more oxidized than the outermost layers of the other portions of the first and the second outer electrodes 13 and 14. For example, on only one of the first and the second primary surfaces 10a and 10b and the first and the second side surfaces 10c and 10d, the outermost layers of the facing front end portions of the first and the second outer electrodes 13 and 14 may be more oxidized than the outermost layers of the other portions of the first and the second outer electrodes 13 and 14. In the case described above, the ion migration of Cu is also suppressed or prevented.

In addition, for example, at least on the first and the second side surfaces 10c and 10d among the first and the second primary surfaces 10a and 10b and the first and the second side surfaces 10c and 10d, the outermost layers of the facing front end portions of the first and the second outer electrodes 13 and 14 may be more oxidized than the outermost layers of the other portions of the first and the second outer electrodes 13 and 14.

In addition, in order to suppress or prevent the ion migration of Cu, the structure can also be conceived in which the entire outermost layer of the outer electrode is made of a copper oxide or a copper oxide alloy. However, in the case described above, the laser resistance of the outer electrode is degraded. On the other hand, in the ceramic electronic component 1, the outermost layers of the first and the second outer electrodes 13 and 14 other than the outermost layers 18 are not oxidized so much. Hence, the ceramic electronic component 1 has an excellent laser resistance. The degree of oxidation of the outermost layers 18 of the facing front end portions of the first and the second outer electrodes 13 and 14 is preferably approximately 30% or less of the length of each of the outer electrodes 13 and 14 in the length direction L, for example.

Figure 5:
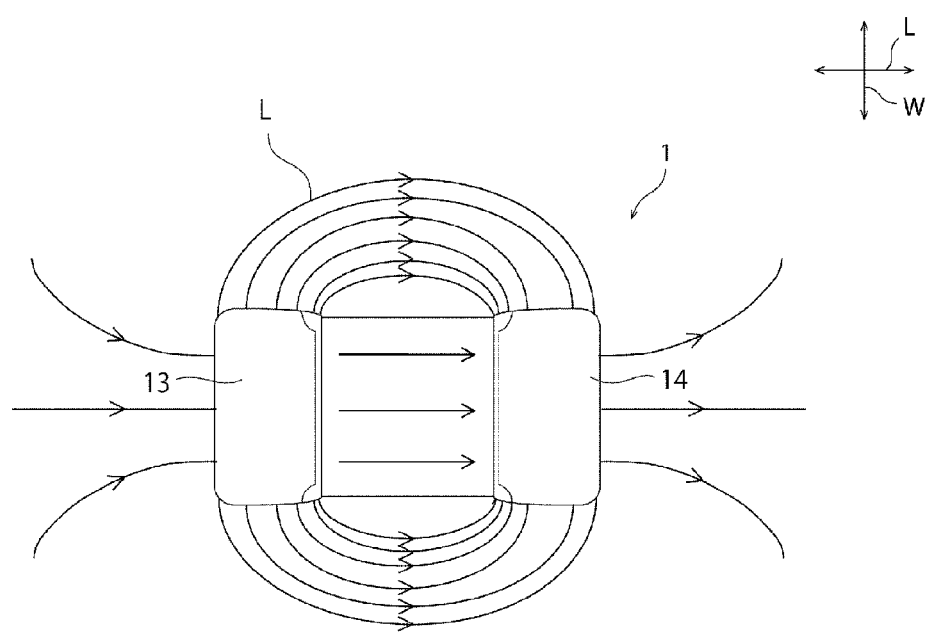
FIG. 5 is a schematic plan view illustrating electric flux lines of the ceramic electronic component according to a preferred embodiment of the present invention.

In addition, as shown in FIG. 3, an oxidized portion provided at a corner section of the outermost layer 18 may have a larger width than that of the other oxidized portion. That is, the length in the length direction L of each of the oxidized portions of the outermost layers 18 provided at central-side corner sections in the length direction L of the outer electrodes 13 and 14 may be larger than the length in the L direction of each of the oxidized portions of the outermost layers provided at the other portions. The reason for this is that as shown in FIG. 5, since the electric flux lines generated in the ceramic electronic component 1 each has a shape defined by the shortest distance between the outer electrodes, the electric field is liable to be concentrated at the corner sections of the outer electrodes 13 and 14. Accordingly, since the oxidized portions of the corner sections of the outer electrodes 13 and 14 each preferably have a larger width than that of each of the oxidized portions of the other portions of the outer electrodes 13 and 14, even if the electric field is concentrated at the corner sections of the outer electrodes 13 and 14, because of the relatively large oxidized portions provided at the corner sections of the first and the second outer electrodes 13 and 14, current is not likely to flow at the corner sections of the first and the second outer electrodes 13 and 14. Hence, the effect of suppressing or preventing the ion migration is further enhanced.

In addition, a method for forming the first and the second outer electrodes 13 and 14 each having the oxidized outermost layer 18 is not particularly limited. The first and the second outer electrodes 13 and 14 each having the oxidized outermost layer 18 can be formed, for example, by the following procedure.

For example, after the outermost layers of the first and the second outer electrodes 13 and 14 are entirely oxidized, portions other than the front end portions may be dipped in an acid or the like to remove oxidized films formed on the portions other than the front end portions. Alternatively, after an oxidizing agent is selectively applied to the front end portions of the first and the second outer electrodes 13 and 14, an oxidation treatment, such as a heat treatment, may be performed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
    a base body including a first primary surface and a second primary surface, a first side surface and a second side surface, and a first end surface and a second end surface; and
    a first outer electrode and a second outer electrode which are arranged on the base body so that front end portions of the first and second outer electrodes face each other and each including outermost layers that contain Cu; wherein
    the outermost layers of the front end portions of the first and the second outer electrodes that face each other are more oxidized than outermost layers of other portions of the first and the second outer electrodes.

2. The ceramic electronic component according to claim 1, wherein
    the first outer electrode is provided on the first end surface and extends therefrom on the first and the second primary surfaces and the first and the second side surfaces;
    the second outer electrode is provided on the second end surface and extends therefrom on the first and the second primary surfaces and the first and the second side surfaces; and
    at least on the first and the second side surfaces among the first and the second primary surfaces and the first and the second side surfaces, the outermost layers of the front end portions of the first and the second outer electrodes that face each other are more oxidized than the outermost layers of the other portions of the first and the second outer electrodes.

3. The ceramic electronic component according to claim 1, wherein the outermost layers of the front end portions of the first and the second outer electrodes that face each other each include a copper oxide or a copper oxide alloy.

4. The ceramic electronic component according to claim 1, wherein the ceramic electronic component is one of a capacitor, a piezoelectric element, a thermistor, an inductor element.

5. The ceramic electronic component according to claim 1, wherein base body is made of one of ceramic, a dielectric ceramic, a piezoelectric ceramic, a semiconductor ceramic, and a magnetic ceramic.

6. The ceramic electronic component according to claim 1, wherein the base body has rectangular or substantially rectangular parallelepiped shape.

7. The ceramic electronic component according to claim 1, wherein a thickness T, a length L, and a width W of the base body satisfy $T \leq W < L$, $\frac{1}{5}W \leq T \leq \frac{1}{2}W$, and $T \leq 0.3$ mm.

8. The ceramic electronic component according to claim 1, wherein a thickness T, a length L, and a width W of the base body satisfy $0.05$ mm $\leq T \leq 0.3$ mm, $0.4$ mm $\leq L \leq 1$ mm, and $0.3$ mm $\leq W \leq 0.5$ mm.

9. The ceramic electronic component according to claim 1, wherein the base body includes internal electrodes arranged in the base body to extend in a length direction and a width direction thereof.

10. The ceramic electronic component according to claim 9, wherein the internal electrodes are rectangular or substantially rectangular.

11. The ceramic electronic component according to claim 9, wherein the internal electrodes are separated by ceramic portions.

12. The ceramic electronic component according to claim 11, wherein the ceramic portions each have a thickness of about 0.5 μm to about 10 μm.

13. The ceramic electronic component according to claim 9, wherein the internal electrodes each have a thickness of about 0.2 μm to about 2 μm.

14. The ceramic electronic component according to claim 1, wherein the outermost layers of the first and second outer electrodes are made of one of Cu—Ag, Cu—Au, Cu—Al, Cu—Ni, and Cu—Pd.

15. The ceramic electronic component according to claim 1, wherein each of the first and second outer electrodes is defined by a laminate including an underlying electrode layer and a plating layer.

16. The ceramic electronic component according to claim 15, wherein the underlying electrode layer includes a metal that diffuses into Cu and an inorganic binder.

17. The ceramic electronic component according to claim 16, wherein the metal that diffuses into Cu is one of Ni, Cu, Ag, Pd, and Au, and an alloy containing at least one of Ni, Cu, Ag, Pd, and Au, and the inorganic binder is made of ceramic.

18. The ceramic electronic component according to claim 16, wherein a thickness of the underlying electrode layer is about 1 μm to about 20 μm and a thickness of the plating layer is about 1 μm to about 10 μm.

19. The ceramic electronic component according to claim 1, wherein each of the first and second outer electrodes is entirely defined by a conductive layer containing Cu.

20. The ceramic electronic component according to claim 16, wherein the outermost layers of the first and second outer electrodes are made of a copper oxide or a copper oxide alloy.

* * * * *